US007235130B2

(12) United States Patent
Hemley et al.

(10) Patent No.: US 7,235,130 B2
(45) Date of Patent: Jun. 26, 2007

(54) APPARATUS AND METHOD FOR DIAMOND PRODUCTION

(75) Inventors: Russell J. Hemley, Chevy Chase, MD (US); Ho-kwang Mao, Washington, DC (US); Chih-shiue Yan, Washington, DC (US); Yogesh K. Vohra, Birmingham, AL (US)

(73) Assignees: Carnegie Institution of Washington, Washington, DC (US); The UAB Research Foundation, Birmingham, AL (US)

( * ) Notice: Subject to any disclaimer, the term of this patent is extended or adjusted under 35 U.S.C. 154(b) by 122 days.

(21) Appl. No.: 11/043,062

(22) Filed: Jan. 27, 2005

(65) Prior Publication Data

US 2005/0160969 A1    Jul. 28, 2005

Related U.S. Application Data

(63) Continuation of application No. 10/288,499, filed on Nov. 6, 2002.

(60) Provisional application No. 60/331,073, filed on Nov. 7, 2001, now Pat. No. 6,858,078.

(51) Int. Cl.
*C30B 24/14* (2006.01)
*C30B 25/14* (2006.01)

(52) U.S. Cl. .............. 117/89; 117/84; 117/92; 117/102

(58) Field of Classification Search .......... 427/577; 423/446; 118/723, 725; 117/68, 75, 98, 117/103, 924, 84, 89, 92, 102
See application file for complete search history.

(56) References Cited

U.S. PATENT DOCUMENTS 5,099,788 A    3/1992  Ito et al. ............ 118/666

5,209,182 A    5/1993  Ohta et al. ............ 118/666
5,704,976 A    1/1998  Snail ................... 117/98

FOREIGN PATENT DOCUMENTS

WO    WO 01/31082 A1    3/2003

OTHER PUBLICATIONS

B.V. Spitsyn et al., "Vapor Growth of Diamond on Diamond and Other Surfaces", Journal of Crystal Growth 52 (1981) pp. 219-226.

(Continued)

*Primary Examiner*—Felisa Hiteshew
(74) *Attorney, Agent, or Firm*—Morgan Lewis & Bockius LLP

(57) ABSTRACT

An apparatus for producing diamond in a deposition chamber including a heat-sinking holder for holding a diamond and for making thermal contact with a side surface of the diamond adjacent to an edge of a growth surface of the diamond, a noncontact temperature measurement device positioned to measure temperature of the diamond across the growth surface of the diamond and a main process controller for receiving a temperature measurement from the noncontact temperature measurement device and controlling temperature of the growth surface such that all temperature gradients across the growth surface are less than 20° C. The method for producing diamond includes positioning diamond in a holder such that a thermal contact is made with a side surface of the diamond adjacent to an edge of a growth surface of the diamond, measuring temperature of the growth surface of the diamond to generate temperature measurements, controlling temperature of the growth surface based upon the temperature measurements, and growing single-crystal diamond by microwave plasma chemical vapor deposition on the growth surface, wherein a growth rate of the diamond is greater than 1 micrometer per hour.

9 Claims, 8 Drawing Sheets

OTHER PUBLICATIONS

Mutsukazu Kamo et al., "Diamond Synthesis From Gas Phase in Microwave Plasma", Journal of Crystal Growth 62 (1983) pp. 642-644.

Jean-Pierre Vitton et al., "High Quality Homoepitaxial Growth of Diamond Films", Diamond and Related Materials, 2 (1993) pp. 713-717.

G.Z. Cao et al., "Growth of {100} Textured Diamond Films by the Addition of Nitrogen" Journal of Applied Physics, vol. 79, No. 3, Feb. 1, 1996, pp. 1357-1364.

S. Jin et al., "Effect of Nitrogen on the Growth of Diamond Films", Applied Physics Letters, vol. 65, No. 4, Jul. 25, 1994, pp. 403-405.

W. Müller-Sebert et al., "Nitrogen Induced Increase of Growth Rate in Chemical Vapor Deposition of Diamond" Applied Physics Letters. vol. 68, No. 1, Jan. 1, 1996, pp. 759-760.

A. Afzal et al., "HFCVD Diamond Grown With Added Nitrogen: Film Characterization and Gas-Phase Composition Studies", Diamond and Related Materials 7 (1998) pp. 1033-1038.

Dr. R.S. Sussmann, A New Diamond Material for Optics & Electronics, IDR Feb. 1993 New Products. pp. 63-72.

X. Jiang et al., "The Coalescence of [001] Diamond Grains Heteroepitaxially Grown on (001) Silicon" Applied Physics Letters, vol. 69, No. 24, Dec. 9, 1996, pp. 3902-3904.

M. Schreck et al., "Diamond Nucleation on Iridium Buffer Layers and Subsequent Textured Growth: A Route for the Realization of Single-Crystal Diamond Films" Applied Physics Letters, vol. 78. No. 2, Jan. 8, 2001, pp. 192-194.

Chih-Shiue Yan et al., "Multiple Twinning and Nitrogen Defect Center in Chemical Vapor Deposited Homoepitaxial Diamond" Diamond and Related Materials 8 (1999), pp. 2022-2031.

M.A. Tamor et al., "On the role of penetration twins in the morphological development of vapor-grown diamond films", Journal of Materials Research, vol. 9, No. 7, Jul. 1994, pp. 1839-1848.

R.E. Stallcup II et al., "Scanning Tunneling Microscopy Studies of Temperature-Dependent Etching of Diamond (100) by Atomic Hydrogen" Physical Review Letters, vol. 86, No. 15, Apr. 9, 2001, pp. 3368-3371.

Yogesh K. Vohra et al., "Resonance Raman and photoluminescence investigations of micro-twins in homoepitaxially grown chemical vapor deposited diamond", Applied Physics Letters, vol. 71, No. 3, Jul. 21, 1997, pp. 321-323.

J. te Nijenhuis et al., "Red luminescence in phosphorous-doped chemically vapor deposited diamond", Journal of Applied Physics, vol. 82 (1), Jul. 1, 1997, pp. 419-422.

Mikka Nishitani-Gamo et al., "Confocal Raman spectroscopic observation of hexagonal diamond formation from dissolved carbon in nickel under chemical vapor conditions" Applied Physics Letters, vol. 73, No. 6, Aug. 10, 1998, pp. 765-767.

C.F.O Graeff et al. "Optical excitation of paramagnetic nitrogen in chemical vapor deposited diamond", Applied Physics Letters, vol. 69, No. 21, Nov. 18, 1996, pp. 3215-3217.

A.T. Collins, "Vacancy enhanced aggregation of nitrogen in diamond", J. Phys. C: Solid St. Phys., 13 (1980), pp. 2641-2650.

Alan T. Collins et al., "Color changes produced in natural brown diamonds by high-pressure, high-temperature treatment", Diamond and Related Materials 9 (2000), pp. 113-122.

Isao Sakaguchi et al., "Suppression of surface cracks on (111) homoepitaxial diamond through impurity limitation by oxygen addition", Applied Physics Letters, vol. 73, No. 18, Nov. 2, 1998, pp. 2675-2677.

Y. Liou et al., "The effect of oxygen in diamond deposition by microwave plasma enhanced chemical vapor deposition", Journal of Materials Research, vol. 5, No. 11, Nov. 1990, pp. 2305-2312.

C. Wild et al., "Oriented CVD diamond films: twin formation, structure and morphology", Diamond and Related Materials, 3 (1994) pp. 373-381.

Chih-Shiue Yan et al., "Very high growth rate chemical vapor deposition of single-crystal diamond", vol. 99 (Oct. 1, 2002) pp. 12523-12525.

Ji-an Zu et al., Moissanite: A Window for High-Pressure Experiments, Science vol. 290, Oct. 27, 2000, pp. 783-785.

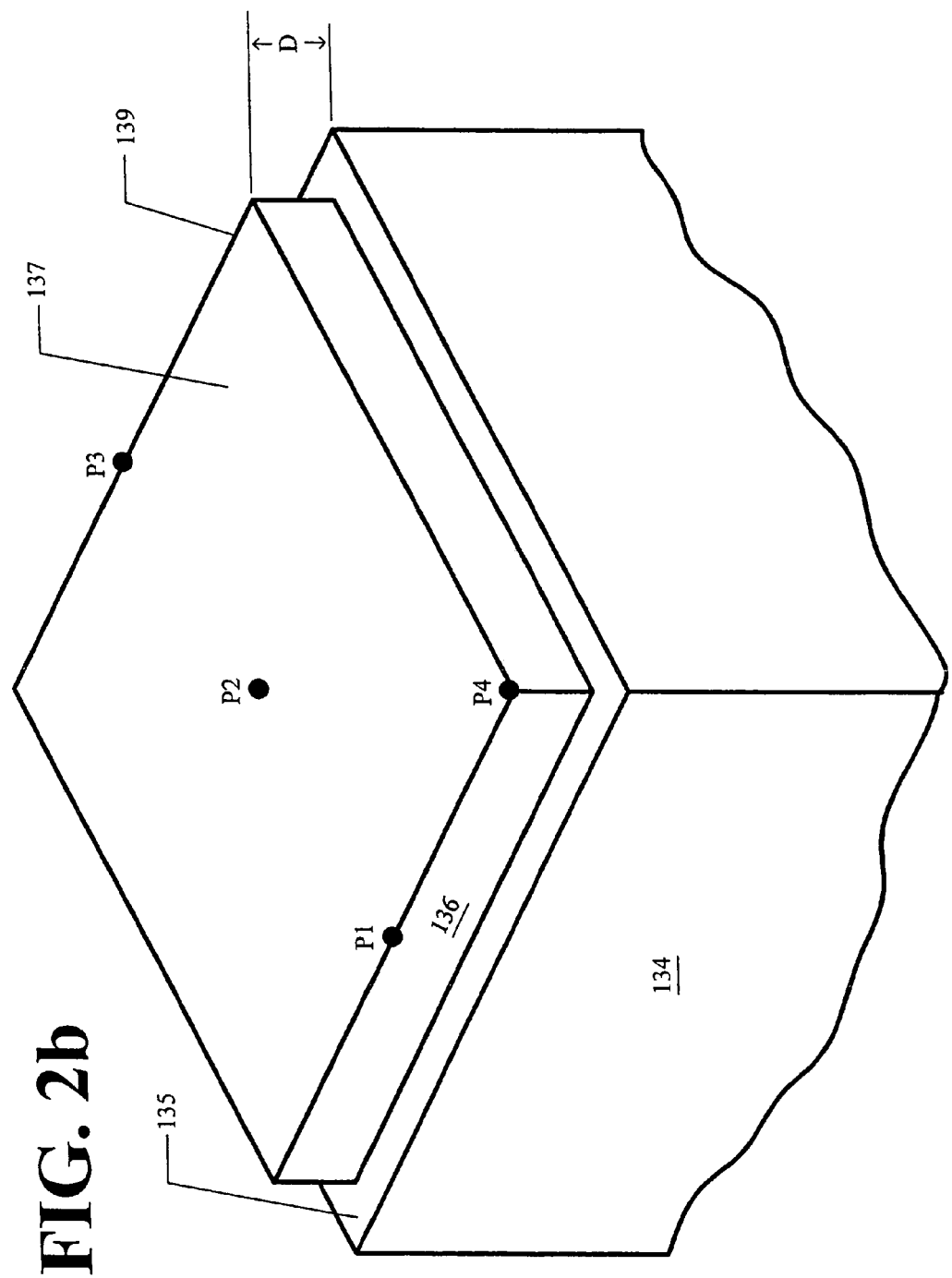

APPARATUS AND METHOD FOR DIAMOND PRODUCTION

This application is a Continuation of U.S. patent application Ser. No. 10/288,499 filed on Nov. 6, 2002 now U.S. Pat. No. 6,858,078 and claims the benefit of Provisional Application No. 60/331,073 filed on Nov. 7, 2001, both of which hereby incorporated by reference in their entirety.

STATEMENT OF GOVERNMENT INTEREST

This invention was made with Government support under Grant Nos. EAR-8929239 and DMR-9972750 awarded by the National Science Foundation. The Government has certain rights in this invention.

BACKGROUND OF THE INVENTION

1. Field of the Invention

The present invention relates to an apparatus and a method for producing diamond, and more particularly, for growing diamond using Microwave Plasma Chemical Vapor Deposition (MPCVD) within a deposition chamber.

2. Description of Related Art

Large-scale production of synthetic diamond has long been an objective of both research and industry. Diamond, in addition to its gem properties, is the hardest known material, has the highest known thermal conductivity, and is transparent to a wide variety of electromagnetic radiation. Therefore, it is valuable because of its wide range of applications in a number of industries, in addition to its value as a gemstone.

For at least the last twenty years, a process of producing small quantities of diamond by chemical vapor deposition (CVD) has been available. As reported by B. V. Spitsyn et al. in "Vapor Growth of Diamond on Diamond and Other Surfaces," Journal of Crystal Growth, vol. 52, pp. 219–226, the process involves CVD of diamond on a substrate by using a combination of methane, or another simple hydrocarbon gas, and hydrogen gas at reduced pressures and temperatures of 800–1200° C. The inclusion of hydrogen gas prevents the formation of graphite as the diamond nucleates and grows. Growth rates of up to 1 µm/hour have been reported with this technique.

Subsequent work, for example, that of Kamo et al. as reported in "Diamond Synthesis from Gas Phase in Microwave Plasma," Journal of Crystal Growth, vol. 62, pp. 642–644, demonstrated the use of Microwave Plasma Chemical Vapor Deposition (MPCVD) to produce diamond at pressures of 1–8 Kpa in temperatures of 800–1000° C. with microwave power of 300–700 W at a frequency of 2.45 GHz. A concentration of 1–3% methane gas was used in the process of Kamo et al. Maximum growth rates of 3 µm/hour have been reported using this MPCVD process.

In the above-described processes, and in a number of more recently reported processes, the growth rates are limited to only a few micrometers per hour. Known higher-growth rate processes only produce or grow polycrystalline forms of diamond. Typically, attempts to produce single-crystal diamond at growth rates higher than about one micrometer per hour result in heavily twinned single crystal diamonds, polycrystalline diamond, or no diamond at all. Further, known processes for growing diamond usually require low pressures of less than 100 torr.

SUMMARY OF THE INVENTION

Accordingly, the present invention is directed to a an apparatus and a method for producing diamond that substantially obviates one or more of the problems due to limitations and disadvantages of the related art.

An object of the present invention relates to an apparatus and method for producing diamond in a microwave plasma chemical vapor deposition system at a high growth rate and at moderate pressures.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an embodiment of the apparatus for producing diamond in a deposition chamber includes a heat-sinking holder for holding a diamond and for making thermal contact with a side surface of the diamond adjacent to an edge of a growth surface of the diamond, a noncontact temperature measurement device positioned to measure temperature of the diamond across the growth surface of the diamond and a main process controller for receiving a temperature measurement from the noncontact temperature measurement device and controlling temperature of the growth surface such that all temperature gradients across the growth surface are less than 20° C.

In another embodiment, a specimen holder assembly for producing diamond includes a diamond, a heat-sinking holder making thermal contact with a side surface of the diamond adjacent to an edge of a growth surface of the diamond, wherein the diamond is slidably mounted within the heat-sinking holder, a stage for receiving thermal energy from the heat-sinking holder, and a first actuator member that can translate along an axis substantially perpendicular to the growth surface for repositioning the diamond within the heat-sinking holder.

In another embodiment, a specimen holder assembly for producing diamond includes a diamond, a heat-sinking holder making thermal contact with a side surface of the diamond adjacent to an edge of a growth surface of the diamond, a thermal mass for receiving thermal energy from the heat-sinking holder, wherein the diamond is retained in the heat-sinking holder by pressure applied through the thermal mass, and a stage for receiving thermal energy from the heat-sinking holder via the thermal mass.

In accordance with another embodiment of the present invention, a method for producing diamond includes positioning diamond in a holder such that a thermal contact is made with a side surface of the diamond adjacent to an edge of a growth surface of the diamond, measuring temperature of the growth surface of the diamond to generate temperature measurements, controlling temperature of the growth surface based upon the temperature measurements, and growing single-crystal diamond by microwave plasma chemical vapor deposition on the growth surface, wherein a growth rate of the diamond is greater than 1 micrometer per hour.

In accordance with another embodiment of the present invention, a method for producing diamond includes positioning diamond in a holder, measuring temperature of a growth surface of the diamond to generate temperature measurements, controlling temperature of the growth surface with a main process controller using the temperature measurements such that all temperature gradients across the growth surface are less than 20° C., growing diamond on the growth surface and repositioning the diamond in the holder.

In accordance with another embodiment of the present invention, a method for producing diamond includes controlling temperature of a growth surface of the diamond such that all temperature gradients across the growth surface are less than 20° C. and growing single-crystal diamond by microwave plasma chemical vapor deposition on the growth surface at a growth temperature in a deposition chamber having an atmosphere with a pressure of at least 130 torr.

In accordance with another embodiment of the present invention, a method for producing diamond includes controlling temperature of a growth surface of the diamond such that all temperature gradients across the growth surface are less than 20° C.; and growing single-crystal diamond by microwave plasma chemical vapor deposition on the growth surface at a temperature of 900–1400° C.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 2b is a perspective view of the diamond and sheath shown in FIG. 1.

DETAILED DESCRIPTION OF THE PREFERRED EMBODIMENTS

Figure 1:
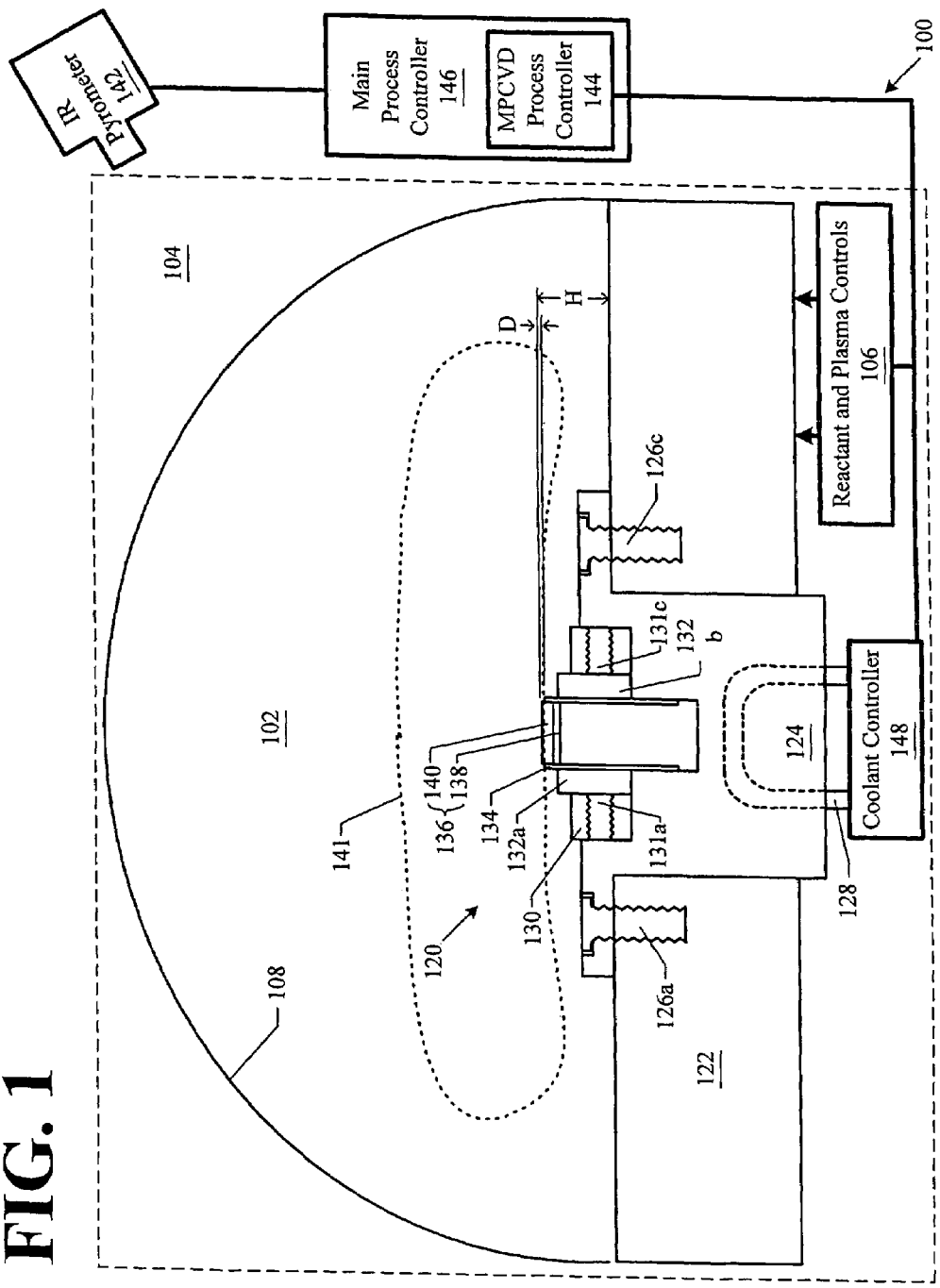
FIG. 1 is a diagram of a diamond production apparatus according to an embodiment of the present invention in which a cross-section of deposition apparatus with a specimen holder assembly for holding the diamond stationary during a diamond growth process is depicted.

Reference will now be made in detail to the preferred embodiments of the present invention, examples of which are illustrated in the accompanying drawings. FIG. 1 is a diagram of a diamond production system 100, according to an embodiment of the present invention, in which a deposition apparatus 102 is depicted in cross-section. The diamond production system 100 includes a Microwave Plasma Chemical Vapor Deposition (MPCVD) system 104 that contains a deposition apparatus 102 as well as reactant and plasma controls 106. For example, the MPCVD system 104 can be a WAVEMAT MPDR 330 313 EHP made by Wavemat, Inc. Such a MPCVD system is capable of producing a 6-kilowatt power output at a frequency of 2.45 GHz, and has a chamber volume of approximately 5,000 cubic centimeters. However, the MPCVD system specifications can vary with the scale of a deposition process in terms of size of the deposition area and/or rate of deposition.

The MPCVD system 104 includes a chamber within the deposition apparatus 102 that is at least in part defined by a bell jar 108, which is used in sealing the chamber. Prior to MPCVD operations, the air within the chamber is withdrawn. For example, a first mechanical type of vacuum pump is used to draw down the chamber and then a second high vacuum type of vacuum pump, such as a turbopump or cryopump, further draws out the air inside the chamber. Plasma is generated within the chamber by a set of plasma electrodes spaced apart within the chamber. Neither the pumps nor the plasma electrodes are illustrated in FIG. 1.

The deposition apparatus 102 also includes a specimen holder assembly 120 installed within the chamber of the MPCVD system 104. Typically, a specimen holder assembly is positioned in the center of the deposition chamber floor 122 of the deposition apparatus 102, as shown in FIG. 1. The specimen holder assembly 120 shown in FIG. 1 is illustrated in cross-section. The specimen holder assembly 120 can include a stage 124 installed in the floor of the deposition apparatus 102.

As shown in FIG. 1, the stage 120 can be attached to the deposition chamber floor 122 using bolts 126a and 126c. The stage 124 can be molybdenum or any other type of material having a high thermal conductivity. In addition, the stage 124 can be cooled during the process of growing diamond by a coolant passing through a coolant pipe 128 within the stage 124. The coolant can be water, a refrigerant or other types of fluid with sufficient heat carrying capacity to cool the stage. Although the coolant pipe is shown as having a U-shaped path through the stage 124 in FIG. 1, the coolant pipe 128 can have a helically shaped path or other types of paths within the stage 124 to more efficiently cool the stage 124.

Positioned on the stage 124 of the specimen holder assembly 120, as shown in FIG. 1, is a set ring 130 having set screws, such as screws 131a and 131c, for tightening collets 132a and 132b around a sheath 134 that holds diamond 136. The sheath 134 is a holder, which makes a thermal contact with a side surface of the diamond 136 adjacent to an edge of a top surface of the diamond 136. Because collets 132a and 132b are tightened onto the sheath 134 by screws 131, the sheath 134 holds the diamond 136 in a stationary position and acts as a heat-sink to prevent the formation of twins or polycrystalline diamond along the edges of the growth surface of the diamond 136.

The diamond 136 can include a diamond seed portion 138 and a grown diamond portion 140. The diamond seed portion 138 can be a manufactured diamond or a natural diamond. As shown in FIG. 1, the top surface or growth surface of the diamond 136 is positioned within a region of the plasma 141 having a resonant power at a height H above the deposition chamber floor 122. The resonant power can be the maximum resonant power within the plasma 141 or a degree thereof. The top surface or growth surface of the diamond 136 is initially the diamond seed portion 138 and is then the grown diamond portion 140 as the diamond grows.

As shown in FIG. 1, the top edge of the sheath 134 is at a distance D just below the top surface or top edges of the diamond 136. The distance D should be sufficiently large enough to expose the edges of the growth surface of the diamond 136 to the plasma 141. However, the distance D can not be so large as to prevent the heat-sinking effect of the sheath 134 that prevents the formation of twins or polycrystalline diamond along the edges of the growth surface of the diamond 136. Thus, D should be within a specified distance range, such as 0–1.5 mm. The distance D and the height H, as shown in FIG. 1, are manually set using the screws 131 of the set ring 130 by positioning the diamond 136 in the sheath, positioning the sheath in the collets 132a and 132b, and then tightening the screws 131.

FIG. 2 is a perspective view of the deposition apparatus shown in FIG. 1. In the center of the deposition chamber floor 122 of FIG. 2 is a circular stage 124 with a central recess 125. As shown in FIG. 2, the stage 124 is held in position by bolts 126a–126d. The stage 124 can be formed of molybdenum or other materials having a high thermal conductivity. A set ring 130 with four screws 131a–131b is positioned within the recess 125 of the stage 124 along with collets 132a–132b. In the alternative, the set ring 130 can be bolted to the stage 124 to increase thermal conductance between the stage and the set ring.

Figure 2A:
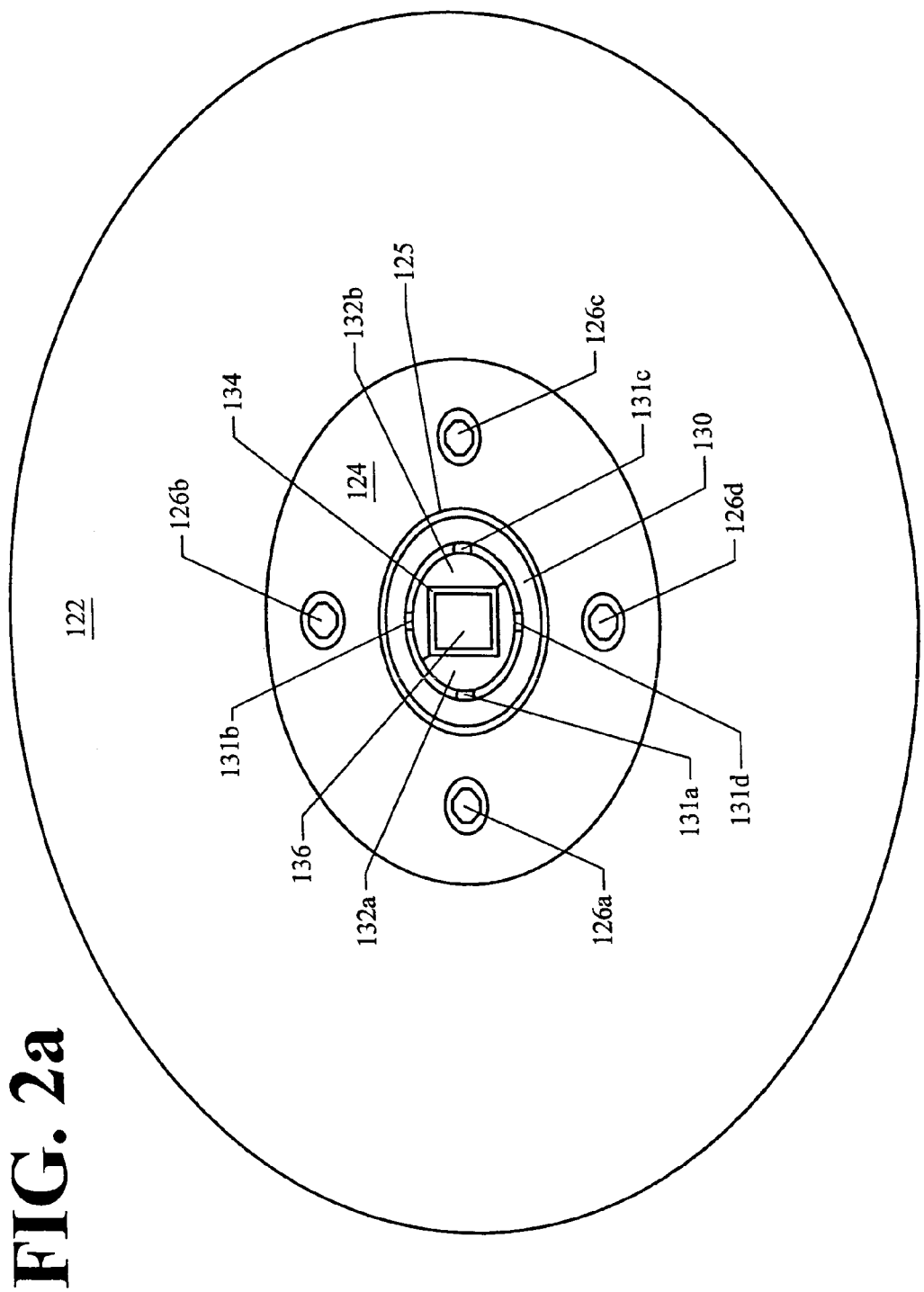
FIG. 2a is a perspective view of the deposition apparatus shown in FIG. 1.

As shown in FIG. 2a, a rectangular sheath 134, which can either be a short length of rectangular tubing or a sheet folded into a rectangle, is positioned in the collets 132a and 132b with a diamond 136 therein. The sheath 124 can be molybdenum or any other type of material having a high thermal conductivity. The screws 131a–131d are tightened on the collets 132a–132b such that the sheath 134 is tightened onto the diamond 136 such that the sheath 134 acts as a heat sink on the four side surfaces of the diamond 136. As shown in FIG. 1, the sheath 134 also makes thermal contact to the stage 124. The collets 132a–32b make thermal contact with the stage 124 and serve as thermal masses for transferring heat from the sheath 134 into the stage 124. The tightening of the sheath 134 onto the diamond 136 increases the quality of the thermal contact between the diamond and the sheath. As shown in FIG. 1, the sheath 134 can also make thermal contact to the stage 124. Although a rectangular shape is shown in FIG. 2a for both the sheath and the diamond, the sheath and the diamond can have any geometric shape such as elliptical, circular or polygonal. The shape of the sheath or holder should be substantially the same as the diamond.

In the exemplary embodiment of the invention shown in FIGS. 1 and 2a, the stage 124 can have a diameter of approximately 10.1 cm. and the sheath 134 can be approximately 2.5 cm wide. Regardless of the dimensions selected for the stage and the sheath 134, the thermal mass of the stage 122, molybdenum sheath 124, and collets 132 can be adjusted to provide an optimal heat sink for the diamond 136. Additionally, the path and extent of the coolant pipes 128 can be modified for greater cooling effect, especially if a particularly large diamond is to be produced. Further, a refrigerant or other low temperature fluids can be used as a coolant.

Molybdenum is only one potential material used in the stage 124, set ring 130, collets 132, sheath 134 and other components. Molybdenum is suitable for these components because it has a high melting point, which is 2617° C., and a high thermal conductivity. In addition, a large graphite build-up does not tend to form on molybdenum. Other materials, such as molybdenum-tungsten alloys or engineered ceramics, having high melting points above the process temperature and a thermal conductivity comparable to that of molybdenum, can alternatively be used instead of molybdenum.

Returning to FIG. 1, another component of the diamond production system 100 is an noncontact measurement device, such as an infrared pyrometer 142, which is used to monitor the temperature of the diamond seed 138 and later the grown diamond 140 during the growth process without contacting the diamond 136. The infrared pyrometer 142 can be, for example, a MMRON M77/78 two color infrared pyrometer from Mikron Instruments, Inc. of Oakland, N.J. The infrared pyrometer 142 is focused on the diamond seed 138 or later on the grown diamond 140 with a target area measure of 2 mm. By using the infrared pyrometer 142, the temperature of the growth surface of the diamond 136 is measured to within 1° C.

The diamond production system 100 of FIG. 1 also includes an MPCVD process controller 144. The MPCVD process controller 144 is typically provided as a component of the MPCVD system 104. As is well-known in the art, the MPCVD process controller 144 exercises feedback control over a number of MPCVD parameters, including, but not limited to, the process temperature, gas mass flow, plasma parameters, and reactant flow rates by using the reactant and plasma controls 106. The MPCVD process controller 144 operates in cooperation with a main process controller 146. The main process controller 146 takes input from the MPCVD controller 144, the infrared pyrometer 142, and from other measuring devices of other components in the diamond production system 100 and carries out executive-level control over the process. For example, the main process controller 146 can measure and control coolant temperatures and/or flow rates of the coolant in the stage using a coolant controller 148.

The main process controller 146 can be a general purpose computer, a special purpose computing system, such as an ASIC, or any other known type of computing system for controlling MPCVD processes. Depending on the type of main process controller 146, the MPCVD process controller 144 can be integrated into the main process controller so as to consolidate the functions of the two components. For example, the main process controller 146 can be a general purpose computer equipped with the LabVIEW programming language from National Instruments, Inc. of Austin, Tex. and the LabVIEW program such that the general purpose computer is equipped to control, record, and report all of the process parameters.

The main process controller 146 in FIG. 1 controls the temperatures of the growth surface such that all the temperature gradients across the growth surface of the diamond are less than or equal to 20° C. Precise control over growth surface temperatures and growth surface temperature gradients prevents the formation of polycrystalline diamond or twins such that a large single crystal diamond can be grown. The ability to control all of the temperature gradients across the growth surface of the diamond 136 is influenced by several factors, including the heat sinking capability of the stage 124, the positioning of the top surface of the diamond in the plasma 141, the uniformity of the plasma 141 that the growth surface of the diamond is subjected to, the quality of thermal transfer from edges of the diamond via the holder or sheath 134 to the stage 124, the controllability of the microwave power, coolant flow rate, coolant temperature, gas flow rates, reactant flow rate and the detection capabilities of the infrared pyrometer 142. Based upon temperature measurements from the pyrometer 142, the main process controller 146 controls the temperature of the growth surface such that all temperature gradients across the growth surface are less than 20° C. by adjusting at least one of microwave power to the plasma 141, the coolant flow rate, coolant temperature, gas flow rates and reactant flow rate.

FIG. 2*b* is a perspective view of the diamond 136 shown in FIG. 1 depicting exemplary points P1, P2, P3 and P4 along the growth surface 137 of the diamond 136. FIG. 2*b* also depicts the distance D between the growth surface 137 or top edges 139 of the diamond 136 and an edge 135 of the sheath 134. Typically, large temperature variations, in terms of temperature differences across the growth surface, occur between the edges and the middle of the growth surface of the diamond. For example, larger temperature gradients occur between the points P1 and P2 than occur between the points P1 and P3. In another example, larger temperature gradients occur between the points P4 and P2 than occur between the points P4 and P3. Thus, controlling temperature of the growth surface of the diamond such that all temperature gradients across the growth surface are less than 20° C. should at least take into account a temperature measurement between the middle and an edge 139 of the growth surface 137. For example, the main controller 146 may control the temperature of the growth surface such that the temperature gradient between points P1 and P2 is less than 20° C.

The spot size of the infrared pyrometer can affect the ability to monitor temperature gradients across the top surface of the diamond and thus the growth rate of the diamond. For example, if the size of the diamond is large in comparison to the spot size of the infrared pyrometer, the temperature at each of the edges of the growth surface of the diamond can be outside of the field of view of the infrared pyrometer. Thus, multiple infrared pyrometers should be used for a diamond with a large growing area. Each of the multiple pyrometers should be focused on different edges about the surface of the diamond and preferably near the corners, if any. Thus, the main process controller 146, as shown in FIG. 1, should be programmed to integrate overlapping fields of view from the multiple pyrometers to produce a contiguous "map" of the temperatures across the diamond's surface or interpolate between non-overlapping fields of view to a produce an interpreted "map" of the temperatures across the diamond's growth surface. In the alternative, the temperature gradient between a single edge or corner point with respect to the middle of the growth surface can be monitored as indicative of the maximum temperature gradient that exists across the growth surface of the diamond.

In addition to the infrared pyrometer 142 for temperature control, other process control instrumentation may be included in the diamond production system 100. Additional process control instrumentation can include equipment for determining the type and quality of the diamond 136 while the growth process is underway. Examples of such equipment include visible, infrared, and Raman spectrometers, which are optical in nature and can be focused on the same point as the infrared pyrometer 142 to obtain data on the structure and quality of the diamond while growth is underway. If additional equipment is provided, it can be connected to the main process controller 146 such that the main process controller 146 controls the instrumentation and presents the results of the analytical methods along with other status information. Additional process control instrumentation may be particularly useful in experimental settings, in "scaling up" a process to produce larger diamonds, and in quality control efforts for an existing diamond production system 100 and corresponding process.

As the diamond 136 grows, both the distance D and the height H increase. As the distance D increases, the heat-sinking capacity of the sheath 134 for the top edges 139 of the growth surface of the diamond 136 reduces. In addition, characteristics of the plasma, such as temperature and/or consistency, change as the growth surface of the diamond 136 extends into the plasma 141. In the diamond production system 100, the growth process is periodically halted so that the position of the diamond 136 can be adjusted downward with respect to the sheath 134 to reduce the distance D, and both the diamond 136 and the sheath 134 can be adjusted downward with respect to the deposition chamber floor 122 to reduce the height H. This repositioning allows the diamond growth of on the growth surface of the diamond 136 to occur within a desired region of resonant power within the plasma 141, allows the infrared pyrometer 142 and any additional instruments to remain focused on the growth surface of the diamond 136, and has the effect of maintaining an efficient thermal contact for sinking heat from the edges of the growth surface of the diamond 136. However, repeatedly halting the growth process can be inconvenient for large-scale production, and increases the chance of introducing contamination into the process if not carefully performed.

Figure 3:
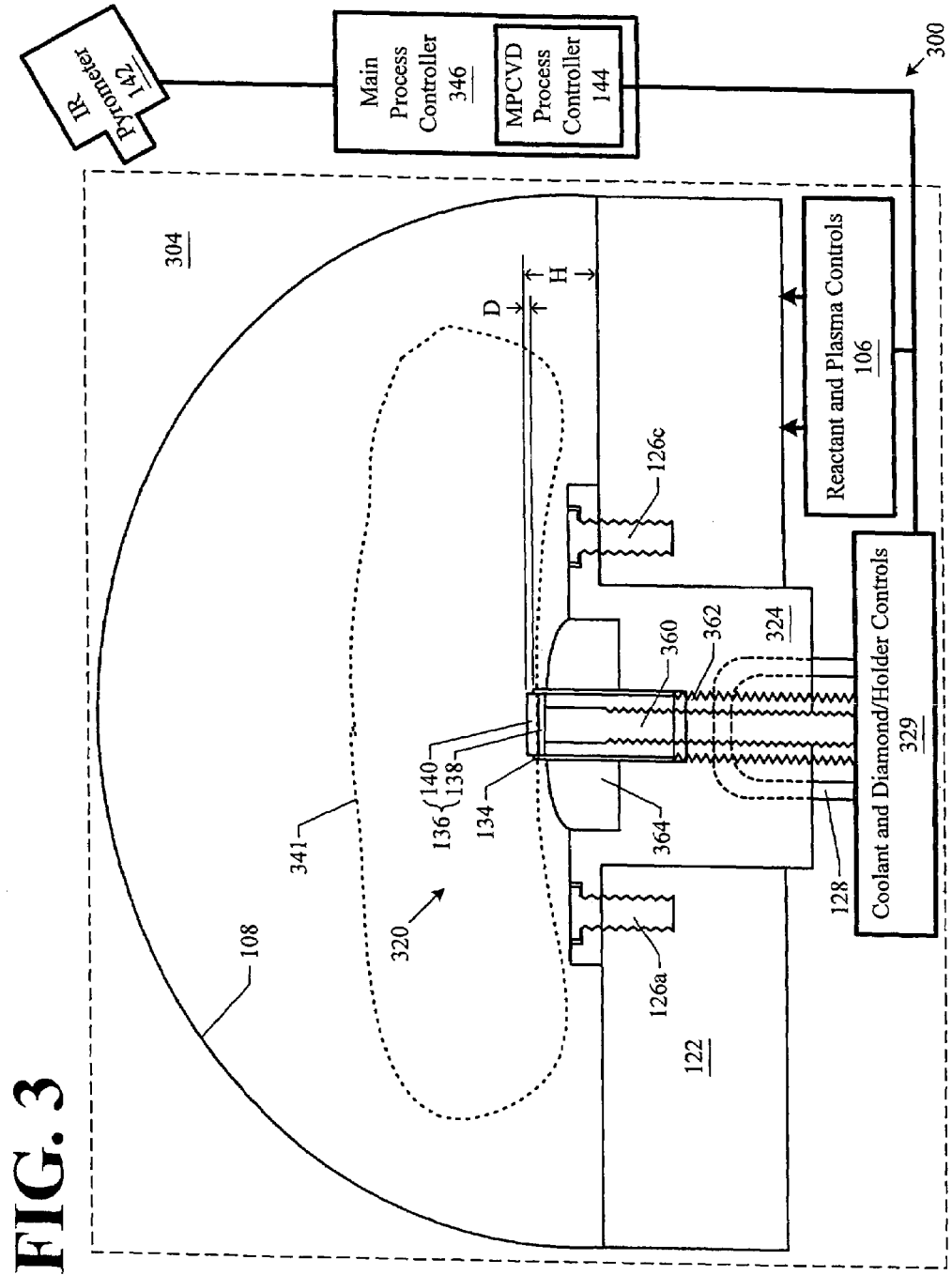
FIG. 3 is a diagram of a diamond production apparatus according to an embodiment of the present invention in which a cross-section of a deposition apparatus with a specimen holder assembly for moving the diamond during the diamond growth process is depicted.

FIG. 3 is a diagram of a diamond production apparatus 300 according to an embodiment of the present invention in which a cross-section of deposition apparatus 304 with a specimen holder assembly 320 for moving the diamond 136 during the diamond growth process is depicted. Some of the components of diamond production apparatus 300 are substantially the same as those of diamond production system 100, and thus, the discussion above with regard to FIG. 1 will suffice to describe those components likewise numbered in FIG. 3. For example, the pyrometer 142, deposition chamber floor 122, coolant pipe 128 and bell jar 108 in FIG. 3 are substantially the same as those described in FIG. 1.

As shown in FIG. 3, the diamond 136 is mounted on a diamond actuator member 360 within the sheath 134 of the specimen holder assembly 320. The diamond 136 is slidably mounted within the sheath 134 on a diamond actuator member 360 that translates along an axis substantially perpendicular to the growth surface. The diamond actuator member 360 protrudes through a stage 324 and is controlled from underneath the stage 324 with a diamond control, which is shown as a part of the coolant and diamond/holder controls 329 in FIG. 3. The diamond actuator member 360 is for setting the height H between the growth surface of the diamond 136 and the deposition chamber floor 122. Although the diamond actuator member 360 in FIG. 3 is shown as a threaded rod, the diamond actuator member can be of any geometric shape that enables positioning of the diamond 136 at height or position above the deposition chamber floor. Those skilled in the art will realize that components placed within the bell jar, such as the diamond actuator member 360, should be vacuum compatible so as to avoid problems in maintaining the desired atmosphere.

The actuator (not shown) for the diamond actuator member 360 is a motor (not shown). However, the actuator can be any one of a number of known types of actuator, depending on the size of diamond that is to be grown, the growth rate, and the level of movement precision required. For example, if the diamond 136 is small in size, a piezo-electric actuator may be used. If the diamond 136 is relatively large or can be grown relatively large, a motorized computer-controllable actuator is preferred. Regardless of the particular actuator employed, the main process controller 346 controls the movement of the diamond actuator member 360 so that the diamond 136 can be automatically moved downward as diamond growth progresses.

In addition, a holder actuator member 362 protrudes through the stage 324 and is controlled from underneath the stage 324 with holder control, which is shown as a part of the coolant and diamond/holder controls 329 in FIG. 3. The holder actuator member 362 translates along an axis substantially perpendicular to the growth surface and is for maintaining the distance D between an edge of the growth surface of the diamond 136 and a top edge of the holder or sheath 134. A diamond production system can have a diamond actuator member, a holder actuator member, or a combination of both.

The holder actuator member 362 in FIG. 3 is threaded into the stage 324 and the diamond actuator member 360 is threaded into the holder actuator member 362. By this arrangement, the diamond and holder controls of the coolant and diamond/holder controls 329 shown in FIG. 3 can move the diamond 136, the sheath 134, or both the sheath 134 and the diamond 136. Although the holder actuator member 362 in FIG. 3 is shown as a threaded cylinder with threading on the inside for the diamond actuator member 360 and threads on the outside for threading into the stage 324, the holder actuator member can be of any geometric shape that enables maintaining a specified distance range between an edge of the growth surface of the diamond 136 and the top edge of the holder or sheath 134. Those skilled in the art will realize that components placed within the bell jar, such as the holder actuator member 362 or a combination of both the holder actuator member and the diamond actuator member, should be vacuum compatible so as to avoid problems in maintaining the desired atmosphere.

Figure 4A:
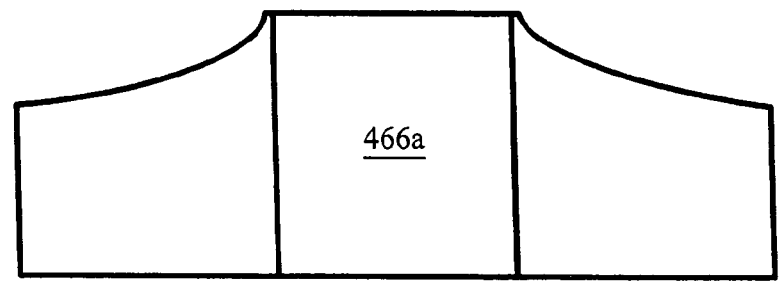
FIGS. 4a–4c depict cross-sectional views of holders or thermal masses that can be used in accordance with the present invention.
Figure 4B:
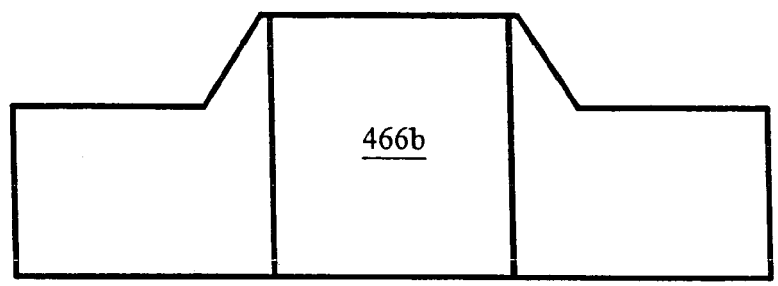
Figure 4C:
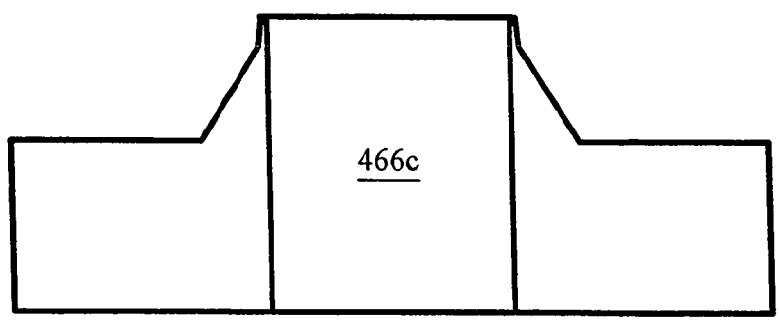

As shown in FIG. 3, a thermal mass 364 is positioned within a recess of the stage 324. The holder or sheath 134 is slidably positioned within thermal mass 364 such that thermal energy is transferred from the sheath 134 to the stage 324. The top surface of the thermal mass 364 can be contoured such that heat can be transferred from the sheath 134 while minimizing the electrical effect of the thermal mass 364 on the plasma 341. Thermal masses 466a, 466b and 466c in FIGS. 4a–4c, respectively, are examples of other contoured thermal masses with different cross-sectional shapes, which in the alternative, can be used in lieu of the thermal mass 364 shown in FIG. 3. A thermal mass can be made of molybdenum. Other materials, such as molybdenum-tungsten alloys or engineered ceramics, having high melting points above the process temperature and a thermal conductivity comparable to that of molybdenum can be used as a thermal mass for transferring heat from a side of the diamond to a stage.

By minimizing the electrical effect of thermal mass 364 on the plasma 341, the region within the plasma 341 in which the diamond is grown will be more uniform. In addition, higher pressure can be used in growing diamond, which will increase the growth rate of single-crystal diamond. For example, pressures can vary from 130 to 400 torr and single-crystal growth rates can be from 50 to 150 microns per hour. Using a higher pressure, such as 400 torr, is possible because the uniformity, shape and/or position of the plasma 341 are not as readily affected by thermal mass 364, which is contoured to remove heat from the edges of the growth surface of the diamond and minimizes the electrical effect of the thermal mass 364 on the plasma 341. In addition, less microwave power, such as 1–2 kW, is needed to maintain the plasma 341. Otherwise, a lower pressure and/or increased microwave power would have to be used to maintain the uniformity, shape and/or position of the plasma 341.

As the diamond 136 grows, both the distance D and the height H increase. As the distance D increases, the heat-sinking capacity of the sheath 134 for the top edges of the growth surface of the diamond 136 decreases. In addition, characteristics of the plasma, such as temperature, change as the growth surface of the diamond 136 extends into the plasma 341. In the diamond production system 300, the growth process is halted when the diamond 136 reaches a predetermined thickness since the distance D and the height H can be controlled by the main process controller 346, via the coolant and diamond/holder controls 329, using the holder actuator member 362 and diamond actuator member 360 during the diamond growing process. This repositioning, either manually or automatically under control of the controller 144, allows the diamond growth on the growth surface of the diamond 136 to occur within a desired region of resonant power within the plasma 341. Further, repositioning allows the infrared pyrometer 142 and any additional instruments to remain focused on the growth surface of the diamond 136, and can maintain an efficient sinking of heat from the edges of the growth surface of the diamond 136.

Figure 5:
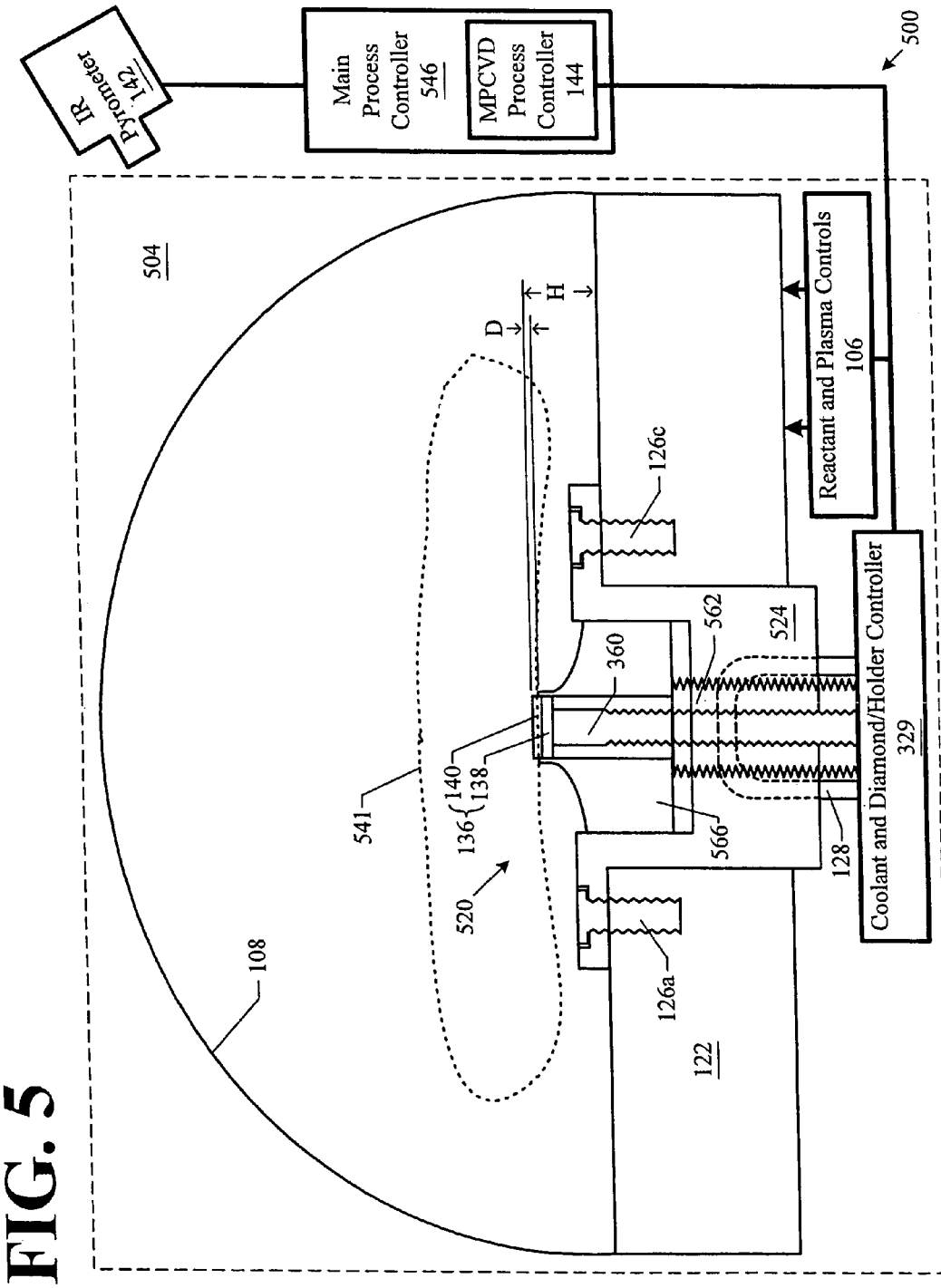
FIG. 5 is a diagram of a diamond production apparatus according to another embodiment of the present invention in which a cross-section of a deposition apparatus with a specimen holder assembly for moving the diamond during the diamond growth process is depicted.

FIG. 5 is a diagram of a diamond production apparatus 500 according to an embodiment of the present invention in which a cross-section of deposition apparatus 504 with a specimen holder assembly 520 for moving the diamond 136 during the diamond growth process is depicted. Some of the components of diamond production apparatus 500 are substantially the same as those of diamond production system 100 and 300, and thus, the discussion above with regard to FIG. 1 and FIG. 3 will suffice to describe those components likewise numbered in FIG. 5. For example, the pyrometer 142, deposition chamber floor 122, coolant pipe 128 and bell jar 108 in FIG. 5 are substantially the same as those described in FIG. 1. In another example, the coolant and diamond/holder controller 329 and diamond actuator member 360 in FIG. 5 are substantially the same as those in FIG. 3.

As shown in FIG. 5, the diamond 136 is mounted on the diamond actuator member 360 and within a contoured thermal mass 566, which acts as a holder. By placing the diamond 136 directly within the contoured thermal mass 566, thermal efficiencies for heat-sinking the diamond 136 are increased. However, the plasma 541 may be more easily affected since the whole contoured thermal mass is moved by the holder actuator 562 in the stage 524 with a diamond holder control, which is shown as a part of the coolant and diamond/holder controls 329 in FIG. 3. Thus, the main process controller 546 should take into account such a factors for appropriately controlling the plasma and/or other parameters of the growth process. In the alternative, the convex thermal mass 364 shown in FIG. 3, the slant-sided thermal mass 466b in FIG. 4b, a slant-sided/cylindrical apex thermal mass 466c in FIG. 4c or other geometric configurations can be used in lieu of the concave thermal mass 566, in FIG. 5.

Figure 6:
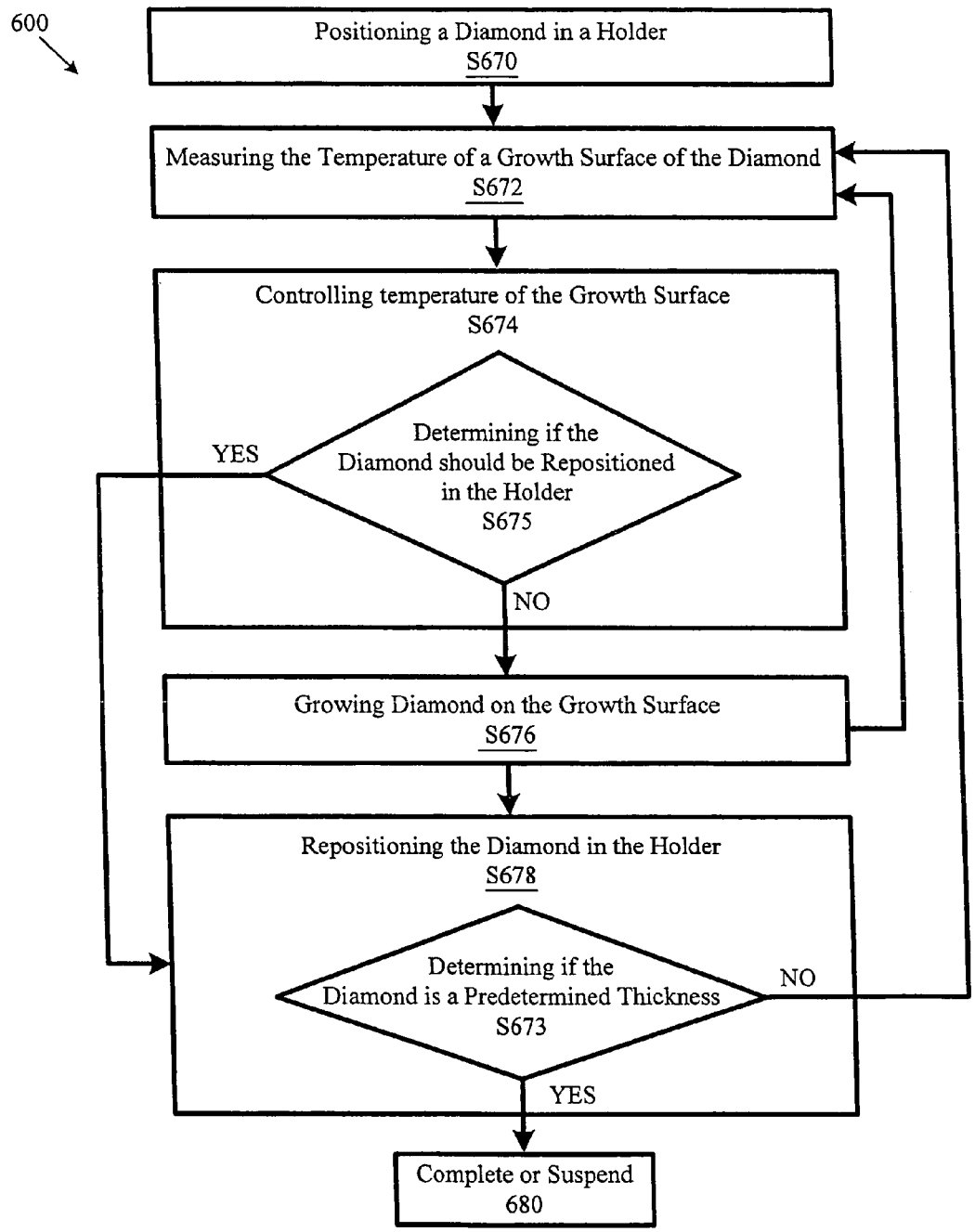
FIG. 6 is a flow diagram illustrating a process 600 in accordance with embodiments of the present invention that can be used with the specimen holder assembly shown in FIG. 1.

FIG. 6 is a flow diagram illustrating a process 600 in accordance with embodiments of the present invention that can be used with specimen holder assembly shown in FIG. 1. The process 600 begins with step S670 in which an appropriate seed diamond or a diamond in the process of being grown is positioned in a holder. In the specimen holder assembly 120 of FIG. 1 for example, the diamond seed portion 138 is placed in a sheath 134 and the screws 131a–131d are tightened by an operator. Other mechanisms can be used to maintain both the sheath and diamond in position, such as spring loaded collets, hydraulics or other mechanisms can be used in exerting a force against the holder or sheath.

As referred to in step S672, the temperature of the growth surface of the diamond, either the diamond seed or grown diamond, is measured. For example, the pyrometer 142 in FIG. 1 takes a measurement of the growth surface, which is the top surface of the growing diamond portion 140, and provides the measurement to the main process controller 146. The measurement is taken such that a thermal gradient across the growth surface of the diamond 136 can be determined by the main process controller or at least the temperature of an edge of the growth surface of the diamond are inputted into the main process controller.

The main process controller, such as main process controller 146 shown in FIG. 1, is used in controlling the temperature of the growth surface, as referred to in S674 in FIG. 6. The main process controller controls the temperature by maintaining thermal gradients of less than 20° C. across the growth surface. While controlling the temperature of the growth surface, a determination is made to whether the diamond should be repositioned in the holder, as shown in step S675 of FIG. 6. If the main controller can not control the temperature of the growth surface of the diamond such that all temperature gradients across the growth surface are less than 20° C. by controlling the plasma, gas flows and coolant flows, then the growth process is suspended so that the diamond can be repositioned in the holder, as shown in step S678 of FIG. 6, for better heat-sinking of the diamond and/or better positioning of the diamond within the plasma. If the main controller can maintain all of the thermal gradients across the growth surface of the diamond to be less than 20° C., then the growing of the diamond on the growth surface occurs as shown in step S676 of FIG. 6.

Measuring the temperature of a growth surface of the diamond, controlling temperature of the growth surface and growing diamond on the growth surface occurs until it is determined that the diamond should be repositioned, as shown in FIG. 6. Although measuring, controlling, growing and the acts of determining are shown and described as steps, they are not necessarily sequential and can be concurrent with one another. For example, the step of growing diamond on the growth surface can occur while measuring the temperature of a growth surface of the diamond and controlling temperature of the growth surface are occurring.

The repositioning of the diamond, as referred to in step S678, can be done manually or with a robotic mechanism. In addition, a determination can be made of whether the diamond has reached a predetermined or desired thickness, as shown in step S673 of FIG. 6. The determination can be based on an actual measurement via mechanical or optical devices. In another example, the determination can be based on the length of processing time in view of known growth rates for the process. If the diamond has reached the predetermined thickness, then the growing process is complete, as referred to by step 680 in FIG. 6. If the diamond has not reached the predetermined thickness, then the growth process is started again and continues with measuring the temperature of a growth surface of the diamond, controlling temperature of the growth surface and growing diamond on the growth surface until it is determined that the diamond needs to be repositioned, as shown in FIG. 6.

Figure 7:
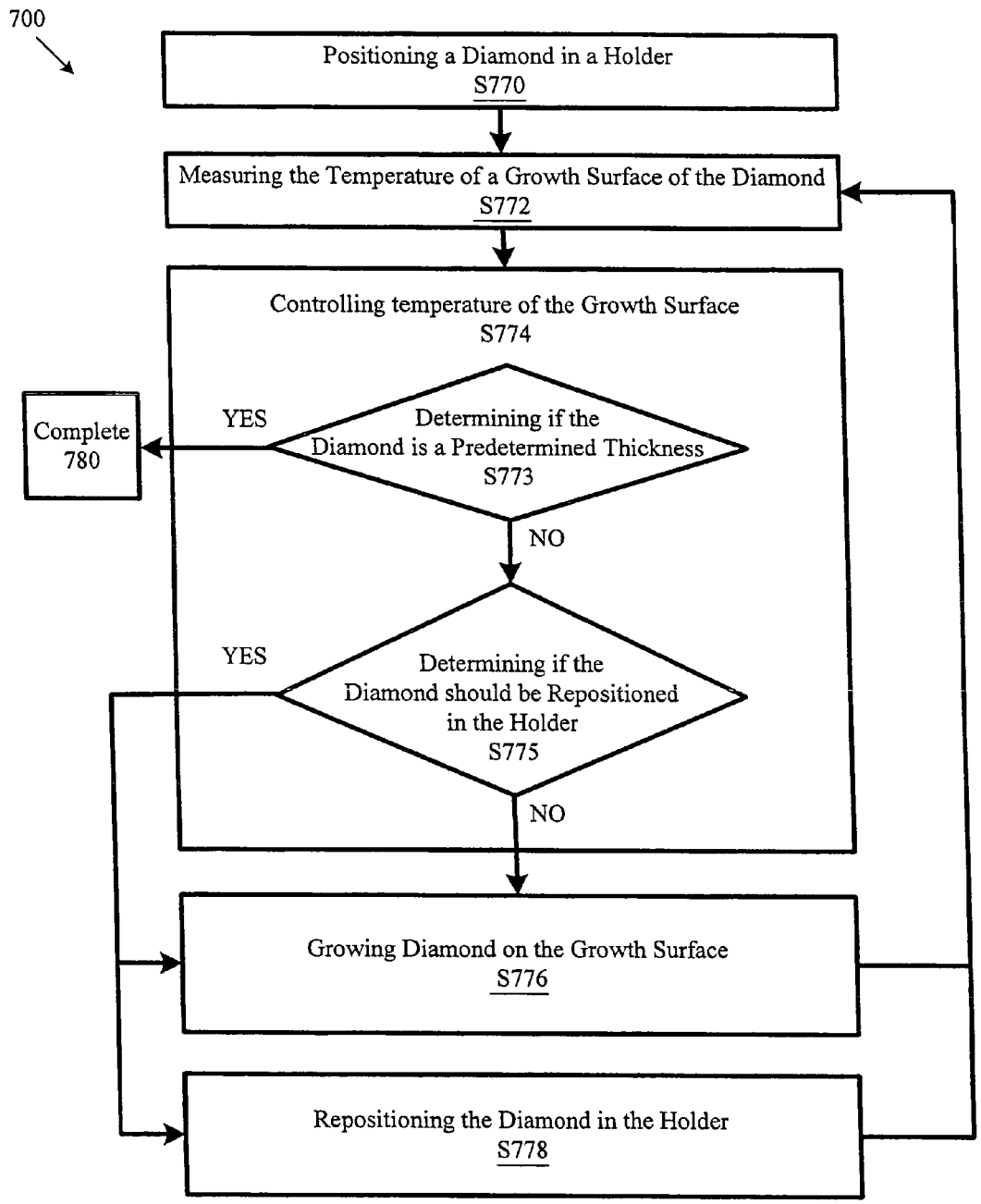
FIG. 7 is a flow diagram illustrating a process 700 in accordance with embodiments of the present invention that can be used with the specimen holder assembly shown in FIG. 3 or with the specimen holder assembly shown in FIG. 5.

FIG. 7 is a flow diagram illustrating a process 700 in accordance with embodiments of the present invention that can be used with specimen holder assembly shown in FIG. 3 and FIG. 5. The process 700 begins with step S770 in which an appropriate seed diamond, which can be a grown diamond, manufactured diamond, natural diamond or combination thereof, is positioned in a holder. In the specimen holder assembly 320 of FIG. 3 for example, the diamond seed portion 138 is placed with in sheath 134 on the diamond actuator member 360, as shown in FIG. 3. In another example of a specimen holder assembly, the diamond seed portion 138 is placed within a contoured thermal mass 566 on the diamond actuator 360, as shown in FIG. 5.

As referred to in step S772, the temperature of the growth surface of the diamond, either the diamond seed or a newly grown diamond portion on the diamond seed, is measured. For example, the pyrometer 142 in FIG. 3 takes a measurement of the growth surface, which is the top surface of the growing diamond portion 140, and provides the measurement to the main process controller 346. In another example, the pyrometer 142 in FIG. 5 takes a measurement of the growth surface, which is the top surface of the seed diamond portion 138, and provides the measurement to the main process controller 546. The measurement is taken such that thermal gradient across the growth surface of the diamond can be determined by the main process controller or at least the temperatures of an edge and the middle of the growth surface are inputted into the main process controller.

A main process controller, such as main process controller 346 or 546, is used in controlling the temperature of the growth surface, as referred to in S774 in FIG. 7. The main process controller controls the temperature of the growth surface of the diamond such that all temperature gradients across the growth surface are less than 20° C. While controlling the temperature of the growth surface, a determination is made to whether the diamond needs to be repositioned in the holder, as shown in step S775 of FIG. 7. If the main controller can not maintain the temperature of the growth surface of the diamond such that all temperature gradients across the growth surface are less than 20° C. by controlling the plasma, gas flows and coolant flows, then the diamond is repositioned while the diamond is growing as shown in FIG. 7 with the "YES" path from step S775 to both of steps S776 and S778. By repositioning the diamond within the holder, the heat-sinking of the edges of the growth surface is improved. In addition, the growth surface can be positioned within an optimal region of the plasma having a consistency for maintaining all of the thermal gradients across the growth surface of the diamond to be less than 20° C. If the main controller can maintain all of the thermal gradients across the growth surface of the diamond to be less than 20° C., then the growing of the diamond on the growth surface occurs without repositioning as shown in the "NO" path from step S775 to step S776 of FIG. 7.

Measuring the temperature of a growth surface of the diamond, controlling temperature of the growth surface, growing diamond on the growth surface and repositioning the diamond in the holder occurs until it is determined that the diamond has reached a predetermined thickness. As referred to in step S773 of FIG. 7, if a determination is made of whether the diamond has reached a predetermined or desired thickness. The determination can be based on an actual measurement via mechanical or optical devices. For example, a tracking program which records the depth or the amount in terms of distance that the diamond had to be repositioned during the growth process. In another example, the determination can be based on the length of processing time in view of known growth rates for the growth process. If the diamond has reached the predetermined thickness, then the growing process is complete, as referred to by step 780 in FIG. 7. If the diamond has not reached the predetermined thickness, then the growth process continues with measuring the temperature of a growth surface of the diamond, controlling temperature of the growth surface, growing diamond on the growth surface and repositioning the diamond in the holder until it is determined that the diamond needs to be repositioned, as shown in the "NO" path from S773 to within S774 of FIG. 7.

When implementing processes 600 and 700, diamond growth is usually continued as long as a "step growth" condition can be maintained. In general, the "step growth" condition refers to growth in which diamond is grown on the growth surface of the diamond 136 such that the diamond 136 is smooth in nature, without isolated "outcroppings" or twins. The "step growth" condition may be verified visually. Alternatively, a laser could be used to scan the growth surface of the diamond 136. A change in laser reflectance would indicate the formation of "outcroppings" or twins. Such a laser reflectance could be programmed into the main process controller as a condition for stopping the growth process. For example, in addition to determining if the diamond is a predetermined thickness, a determination can also be made of whether a laser reflectance is being received.

In general, the methods in accordance with exemplary embodiments of the present invention are designed to create large, high-quality diamonds with increased [100] growth rates. The process temperature may be selected from a range of about 900–1400° C., depending on the particular type of single-crystal diamond that is desired or if oxygen is used. Polycrystalline diamond may be produced at higher temperatures, and diamond-like carbon may be produced at lower temperatures. During the growth process, a pressure of about 130–400 torr is used, with a methane concentration in the range of 6–12% methane. A hydrocarbon concentration greater than 15% may cause excessive deposition of graphite inside the MPCVD chamber. A 1–5% $N_2/CH_4$ added to the reactant mix creates more available growth sites, enhances the growth rate, and promotes {100} face growth. Other aspects of the invention can be understood in greater detail from the following examples.

EXAMPLE 1

A diamond growth process was conducted in the above-described MPCVD chamber in FIG. 1. First, a commercial 3.5×3.5×1.6 mm³ high pressure high temperature (HPHT) synthetic type Ib diamond seed was positioned in the deposition chamber. The diamond seed has polished, smooth surfaces that were ultrasonically cleaned with acetone. The deposition surface was within two degrees of the {100} surface of the diamond seed.

Then, the deposition chamber was evacuated to a base pressure of $10^{-3}$ torr. The infrared pyrometer 142 was focused though a quartz window at an incident angle of 65 degrees on the growth surface of the diamond and had a minimum 2 mm² diameter spot size. Diamond growth was performed at 160 torr pressure using gas concentrations of 3% $N_2/CH_4$, and 12% $CH_4/H_2$. The process temperature was 1220° C., and gas flow rates were 500 sccm $H_2$, 60 sccm $CH_4$, and 1.8 sccm $N_2$. Deposition was allowed to continue for 12 hours.

The resulting diamond was 4.2×4.2×2.3 mm³ unpolished, and represented about 0.7 mm of growth on the seed crystal that was grown at a growth rate 58 microns per hour. The growth morphology indicated that the <100> side growth rate was faster than the <111> corner growth rate. The growth parameter, α, was estimated at 2.5–3.0.

The deposited diamond was characterized using x-ray diffraction (XRD), Raman spectroscopy, photoluminescence (PL) spectroscopy and electron paramagnetic resonance (EPR). The X-ray diffraction study of the resulting diamond confirmed that it was a single crystal, with a small degree of polycrystallinity localized at the top edges of the diamond. Visible/near infrared transmission spectra of the MPCVD grown diamond and seed diamonds confirm that nitrogen is incorporated effectively into the crystal structure. Raman spectroscopy demonstrates that the top face of the MPCVD grown diamond has different optical characteristics than the seed diamond but has the same internal stress.

A number of MPCVD diamonds were produced according to the guidelines of Example 1 while varying the described process temperature. These experiments demonstrate the process temperature ranges for producing various types of diamond in the growth process according embodiments of the present invention. Table 1 sets forth the results of these additional experiments.

TABLE 1

Process temperatures for various types of diamond

| Temperature Range | Type of Diamond Produced |
| --- | --- |
| <1000° C. | Spherical, black diamond-like carbon (DLC) |
| 1000–1100° C. | Smooth dark brown |
| 1100–1200° C. | Brown |
| 1200–1220° C. | Smooth, yellow tint growth |
| 1220–1400° C. | Step-flow type with pyramid like octahedra tinted yellow |
| >1300° C. | Twinned or polycrystalline diamond |

EXAMPLE 2

A high-quality, pure CVD single crystal diamond over 0.6 mm in thickness was created substantially in accordance with the procedure of Example I above by adding a small amount (1–3%) of oxygen and lowering the growth temperature to 900 degrees Celsius. The added oxygen allows a lower growth temperature, which removes the nitrogen-related impurities and reduces the silicon and hydrogen impurity levels. The growth rate using this process is approximately 10 m/hr, less than that of Example 1, but still greater than conventional processes.

The colors of diamond formed by the methods discussed above be changed by annealing. For example, a yellow of brown diamond can be annealed into a green diamond. Additional information with regard to the diamond produced in the examples described above is in a paper by the inventors entitled "Very High Growth Rate Chemical Vapor Deposition of Single-Crystal Diamond" Proceedings of the National Academy of the Sciences, Oct. 1, 2002, volume 99, no. 20., pages 12523–12525, which is hereby incorporated by reference in its entirety. Diamond produced by the above methods and apparatus will be sufficiently large, defect free and translucent so as to be useful as windows in high power laser applications or as anvils in high pressure apparatuses.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for diamond production, comprising:
    positioning a diamond in a holder such that a thermal contact is made with a side surface of the diamond adjacent to an edge of a growth surface of the diamond;
    measuring a temperature of the growth surface of the diamond to generate temperature measurements;
    controlling the temperature of the growth surface based upon the temperature measurements;
    growing a single-crystal diamond by microwave plasma chemical vapor deposition on the growth surface, wherein a growth rate of the diamond is greater than 1 micrometer per hour; and
    repositioning the diamond in the holder while growing diamond; and
    repositioning the holder with the diamond while growing diamond.

2. The method of claim 1, wherein the atmosphere includes hydrogen, 1–5% nitrogen per unit of hydrogen and 6–12% methane per unit of hydrogen.

3. The method of claim 2, wherein the atmosphere further includes 1–3% oxygen per unit of hydrogen.

4. The method of claim 3, wherein the growth temperature is 900–1400° C.

5. The method of claim 1, wherein the atmosphere includes 3% nitrogen per unit of hydrogen and 12% methane per unit of hydrogen.

6. The method of claim 1, wherein the pressure is 130–400 torr.

7. The method of claim 1, wherein the growth temperature is 1000–1400° C.

8. The method of claim 1, further comprising the steps of:
    determining a thickness of the diamond; and
    stopping the growth of diamond.

9. The method of claim 1, wherein a growth rate of the single-crystal diamond is 150 micrometer per hour.

* * * * *